(12) United States Patent
Bogner

(10) Patent No.: US 10,343,292 B2
(45) Date of Patent: Jul. 9, 2019

(54) END EFFECTOR

(71) Applicant: SUSS MicroTec Lithography GmbH, Garching bei Muenchen (DE)

(72) Inventor: Bernhard Bogner, Garching bei Muenchen (DE)

(73) Assignee: SUSS MICROTEC LITHOGRAPHY GMBH (DE)

(*) Notice: Subject to any disclaimer, the term of this patent is extended or adjusted under 35 U.S.C. 154(b) by 0 days.

(21) Appl. No.: 15/875,708

(22) Filed: Jan. 19, 2018

(65) Prior Publication Data

US 2018/0215048 A1    Aug. 2, 2018

(30) Foreign Application Priority Data

Jan. 27, 2017    (NL) .................................... 2018244

(51) Int. Cl.

| B25J 15/06 | (2006.01) |
| H01L 21/683 | (2006.01) |
| H01L 21/687 | (2006.01) |
| B32B 15/04 | (2006.01) |
| G03F 7/20 | (2006.01) |
| B25J 15/00 | (2006.01) |

(52) U.S. Cl.
CPC ....... B25J 15/0683 (2013.01); B25J 15/0014 (2013.01); B25J 15/0616 (2013.01); B32B 15/04 (2013.01); G03F 7/7075 (2013.01); H01L 21/6838 (2013.01); H01L 21/68707 (2013.01); Y10S 901/40 (2013.01)

(58) Field of Classification Search
CPC .......... B25J 11/0095; B25J 15/0014; B25J 15/0616; B25J 15/0683; H01L 21/6838; H01L 21/68707; Y10S 414/141; Y10S 901/40; B32B 15/04

USPC ......................................................... 294/213
See application file for complete search history.

(56) References Cited

U.S. PATENT DOCUMENTS

| 4,620,738 A | * | 11/1986 | Schwartz ............... B65G 47/91 271/90 |
| 5,226,636 A | * | 7/1993 | Nenadic ................. B25B 11/005 269/21 |
| 5,556,147 A | | 9/1996 | Somekh et al. ............. 294/64.1 |
| 6,244,641 B1 | * | 6/2001 | Szapucki ............. B25J 15/0616 294/188 |
| 6,942,265 B1 | * | 9/2005 | Boyd ................ H01L 21/67742 294/189 |
| 7,055,875 B2 | * | 6/2006 | Bonora ............... H01L 21/6838 294/188 |

(Continued)

FOREIGN PATENT DOCUMENTS

| JP | 2004186355 | 7/2004 | ............. H01L 21/68 |
| JP | 2011110682 | 6/2011 | ............. B25J 15/08 |

OTHER PUBLICATIONS

Netherlands Search Report (w/translation of relevant portions) issued in application No. 2018244, dated Nov. 2, 2017 (9 pgs).

*Primary Examiner* — Dean J Kramer
(74) *Attorney, Agent, or Firm* — Hayes Soloway P.C.

(57) ABSTRACT

An end effector for holding substrates has a multi-layered main body and a fluid channel which is provided in the main body. The main body has a receiving end and a fastening end, and include at least two layers, wherein at least one of the layers is not inherently stable, and is formed from a synthetic material film.

20 Claims, 4 Drawing Sheets

(56) References Cited

U.S. PATENT DOCUMENTS

| | | | | |
|---|---|---|---|---|
| 7,871,705 | B2* | 1/2011 | Miller | B25J 9/0012 |
| | | | | 428/418 |
| 7,909,374 | B2* | 3/2011 | Thallner | H01L 21/6838 |
| | | | | 294/212 |
| 9,187,256 | B2* | 11/2015 | Iwasaka | H01L 21/6838 |
| 2005/0110292 | A1* | 5/2005 | Baumann | B25J 9/0012 |
| | | | | 294/188 |
| 2008/0247857 | A1* | 10/2008 | Yuasa | B25J 9/0012 |
| | | | | 414/680 |
| 2009/0293663 | A1* | 12/2009 | Chang | B25J 9/0012 |
| | | | | 74/490.01 |
| 2013/0082475 | A1* | 4/2013 | Fukano | B65G 47/91 |
| | | | | 294/188 |
| 2015/0086316 | A1 | 3/2015 | Greenberg et al. | H01L 21/677 |
| 2015/0290815 | A1* | 10/2015 | Pergande | B25J 15/0014 |
| | | | | 294/213 |
| 2016/0001449 | A1* | 1/2016 | Pergande | B25J 15/0014 |
| | | | | 361/234 |
| 2016/0254176 | A1* | 9/2016 | Monaco | B25J 11/0095 |
| | | | | 294/188 |

* cited by examiner

END EFFECTOR

FIELD OF THE DISCLOSURE

The disclosure relates to an end effector for holding substrates.

BACKGROUND

End effectors are the last element of a kinematic chain of transport apparatuses, e.g. robots. They are used e.g. for gripping or holding objects.

In the production of micro-structure components, e.g. in chip manufacturing, end effectors are usually used to hold substrates in order to move substrates between different process stations.

Within the scope of this invention, substrates include in particular wafers, such as semiconductor wafers or glass wafers, flexible substrates, wafers which are produced synthetically from chips and casting compound (reconstituted wafers; moulded wafers with embedded dies) or substrates having 3-dimensional surfaces.

Such end effectors are known and usually consist of a main body having e.g. a milled vacuum channel and a cover which closes the vacuum channel. Suction can be applied to the wafer and it can be held by means of vacuum technology through openings in the cover. However, by reason of their construction, such end effectors are thick and troublesome to produce.

The wafers to be picked up by the end effector are frequently disposed in a wafer cartridge. In order to remove individual wafers from the wafer cartridge, the end effector is first moved between two wafers in the cartridge and is moved or brought into connection with one of the wafers in order to fix said wafer, e.g. by means of a vacuum or by means of excess pressure using the Bernoulli effect.

In order to accommodate the largest possible number of wafers in a wafer cartridge, the wafers are frequently disposed at a very small spacing from one another. Furthermore, wafers can be flexible and can sag when disposed horizontally, whereby the spacing between the wafers can be further reduced. The end effector must then also be able to be guided reliably between the wafers without contacting wafers e.g. on the "end face" and thereby damaging them.

SUMMARY

Thus, the object of the invention is to provide an end effector which is particularly thin and easy to produce.

The object is achieved by means of an end effector for holding substrates, having a main body and a fluid channel which is provided in the main body, wherein the main body comprises at least two layers, wherein at least one of the layers is not inherently stable.

"Not inherently stable" means that the layer is not stable enough to independently hold a substrate, for which the corresponding end effector is provided, in the holding region provided for this purpose. The at least one layer can thus be thin, whereby the whole construction height, i.e. the thickness, of the end effector can be reduced. It is even feasible for a plurality of layers or all layers of the end effector not to be inherently stable and to have the necessary stability to hold a substrate only once fastened to one another. The layer which is not inherently stable can be e.g. a thin film, or the end effector can be built up of a plurality of very thin metal sheets. The fluid channel can thus serve as a vacuum channel or excess pressure channel depending on whether the end effector is to be operated with a compressed air source or a vacuum source.

In the context of the invention, the term "layer" refers to prefabricated layer, i.e. a prefabricated component in the solid state, in particular being flat and/or plate like. Two or more of the prefabricated components may be attached to one another to form the end effector.

The prefabricated layer may already have the contour of the end effector or two or more layers are attached to one another and then cut into the desired shape of the end effector.

A coating or a liquid material applied to a prefabricated layer does not form a layer of its own in the sense of the invention, even when solidified The end effector can approach substrates both from below and also from above and hold or fix them from below or from above.

Preferably, a groove and/or a slot is incorporated in at least one of the layers and can partially define the fluid channel, whereby the fluid channel can easily be formed.

In order to simplify the production process, the groove and/or the slot can be covered and therefore sealed by at least another one of the layers.

In one embodiment of the invention, the main body comprises three layers, wherein the middle one of the layers is provided with the slot and/or the groove, which is covered by the outer two layers, thus forming the fluid channel. Thus, at least one of the outer two layers can be the layer which is not inherently stable. Therefore, a flatter or thinner end effector is provided.

For example, one of the layers, in particular the layer in which the groove and/or the slot is incorporated, is produced from a metal sheet. The metal sheet can be of high-grade steel or molybdenum. The metal sheet can also be produced from titanium, aluminium with different coatings, or quartz glass. It is thereby ensured that the fluid channel always has the desired shape.

The at least two layers may be congruent to one another and/or may have the contour of the end effector. This saves an assembly step.

In a variant, at least one of the at least one layer is a prefabricated component, simplifying the assembly.

One of the layers, in particular the layer which is not inherently stable, is preferably produced from a synthetic material, in particular a synthetic material film. The synthetic material is e.g. polyether ether ketone (PEEK). The layer of synthetic material is in particular the uppermost or lowermost layer of the main body. Therefore, in particular, the layer which is not inherently stable can be produced inexpensively and consistently.

For example, a layer which is not inherently stable, produced from polyether ether ketone (PEEK) or a comparable synthetic material has a thickness of 0.1 mm or less.

In order to ensure the sealing tightness of the fluid channel, the at least two layers can be adhered together. Alternatively, the at least two layers can also be welded. In addition, the two layers can also be screwed, whereby the stability of the end effector is further increased.

In one embodiment of the invention, the main body comprises a receiving end and a fastening end, wherein a holding region for holding the substrate is provided on the receiving end so that the substrate can be reliably held on the end effector.

A cut-out preferably extends from the receiving end into the main body, wherein holding arms are formed by the cut-out. The cut-out can extend through all the layers.

Therefore, substrates can be picked up by the end effector and held on their underside approximately centrally e.g. by holding pins, e.g. at a station in a machine.

In order to improve the stability of the individual layers and of the whole main body, the cut-out can comprise at least one radius on its end facing the fastening end and in particular can be U-shaped.

In one embodiment variant, the fluid channel extends from the fastening end into the holding region, in particular into the holding arms, and at that location issues into openings. Thus, the fluid channel can have a U-shaped portion. The negative pressure or excess pressure required to hold the substrate can be provided in the holding region through the fluid channel.

For example, the limbs of the U of the U-shaped portion of the fluid channel extend into the holding arms. The fluid channel can as a whole be Y-shaped or in the shape of a tuning fork.

At least one opening is preferably provided in one of the layers, in particular in one of the holding arms, through which opening the fluid channel issues in the holding region. Thus, at least one opening can be provided per holding arm. The opening is provided in the uppermost layer. The side of the main body against which the substrate lies when the end effector is being used as intended is designated as 'upper' or as the 'upper side'.

In one embodiment of the invention, a holding apparatus is provided in or at the opening and in particular comprises a sealing lip, whereby the substrate can be fixed in a reliable manner.

For example, the holding apparatus is a suction apparatus, in particular a vacuum suction cup or a fixing apparatus based on the Bernoulli effect. In this way, substrates can be fixed on the end effector either by negative pressure or by excess pressure.

The suction apparatus can comprise the sealing lip. The suction apparatus can also comprise vacuum furrows or grooves and/or a porous material.

A flange region, in particular a flange plate, can be provided on the fastening end in order to fasten the end effector to a transport apparatus, in particular a robotic arm.

DESCRIPTION OF THE DRAWINGS

Further advantages and features of the invention will be apparent from the following description and the enclosed drawings to which reference is made. In the drawings.

DETAILED DESCRIPTION

Figure 1:
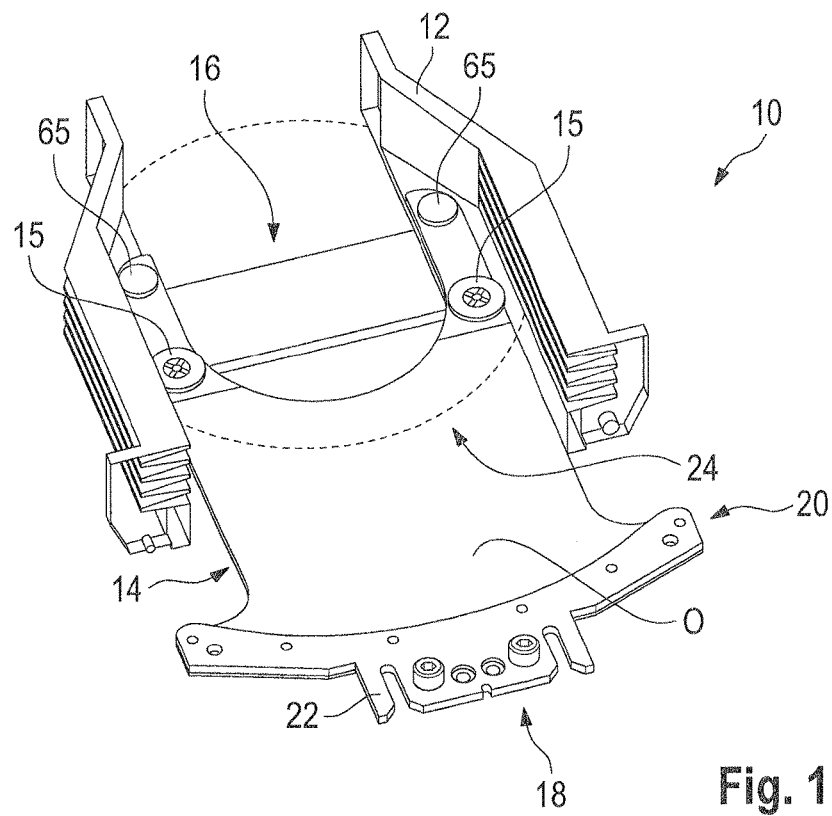
FIG. 1 shows a perspective view of an end effector in accordance with the invention, which has been introduced into a cartridge.

FIG. 1 shows an end effector 10 which is introduced into an empty cartridge 12 for storage of substrates (not shown).

End effectors 10 are components of robots at the end of a kinematic chain. The illustrated end effector 10 is a holder or gripper, with which substrates such as wafers can be picked up and moved. Accordingly, it can be connected to a robotic arm (not shown).

The end effector 10 has a main body 14 and two holding apparatuses 15, wherein the main body 14 has a receiving end 16 and a fastening end 18.

A flange region 20 is provided at the fastening end 18, in which flange region a flange plate 22 is fastened to the main body 14. The flange plate 22 serves to fasten the end effector 10 to the robotic arm.

Figure 2:
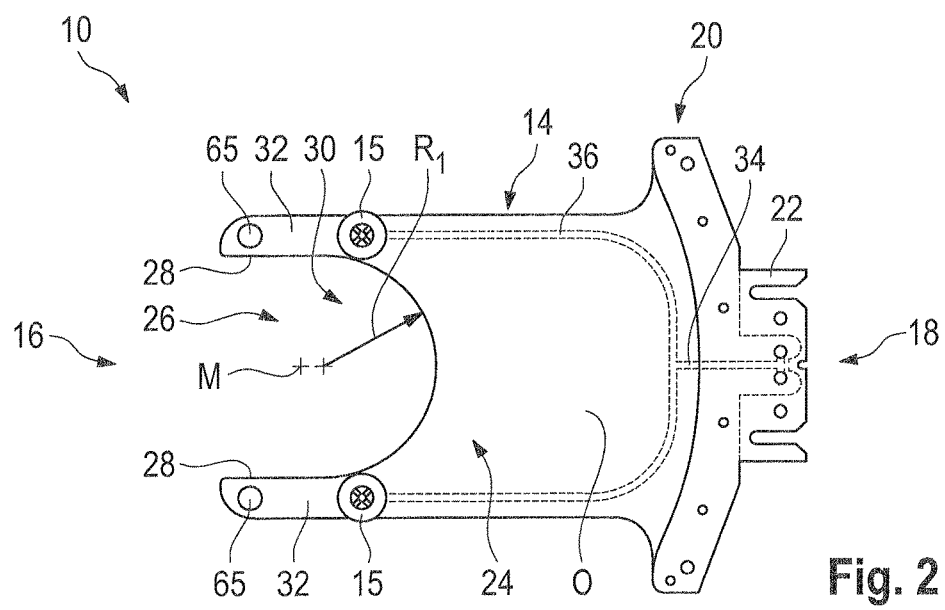
FIG. 2 shows a plan view of the end effector in accordance with the invention as shown in FIG. 1.

At the receiving end 16, a holding region 24 for holding a substrate (indicated by a broken line in FIG. 1) is formed on the upper side O of the end effector 10. In FIG. 2, the centre point M of a circular substrate is indicated as where the substrate is intended to be received in the holding region 24.

A cut-out 26 extends from the receiving end 16 into the main body 14 towards the fastening end 18.

The cut-out 26 firstly has two parallel side walls 28 starting from the receiving end 16, which side walls are then connected together by a transition region 30. In this first embodiment, the transition region 30 has a radius $R_1$ so that the transition region 30 is semi-circular.

In particular, the cut-out 26 is a U-shaped aperture in the main body 14 on the side of the main body 14 facing away from the fastening end 18.

Holding arms 32 on the main body 14 are formed by the cut-out 26, the parallel side walls 28 being the inner sides of said main body.

In addition, a fluid channel 34 is formed in the main body 14 and extends from the flange region 20, i.e. from the fastening end 18, in the direction of the receiving end 16.

In the illustrated embodiment, the fluid channel 34 is a vacuum channel. However, the fluid channel 34 can also be an excess pressure channel.

As shown in FIG. 2, the fluid channel 34 starts from the flange region 20 and branches into two branches 36 which extend in the holding region 24 as far as into the holding arms 32.

The fluid channel 34 as a whole is Y-shaped or in the shape of a tuning fork, wherein the two branches 36 form a U-shaped portion of the fluid channel 34. The limbs of the U are thus formed by the parts of the branches 36 which extend into the holding arms 32.

At the end of the branches 36 a respective opening 38 is provided in the main body 14 so that the fluid channel 34 issues in the holding region 24 on the upper side O.

The holding apparatuses 15 are fastened in the openings 38. Therefore, the holding apparatuses 15 can be disposed on the holding arms 32. Thus, at least one opening 38 is provided per holding arm 32.

Figure 3:
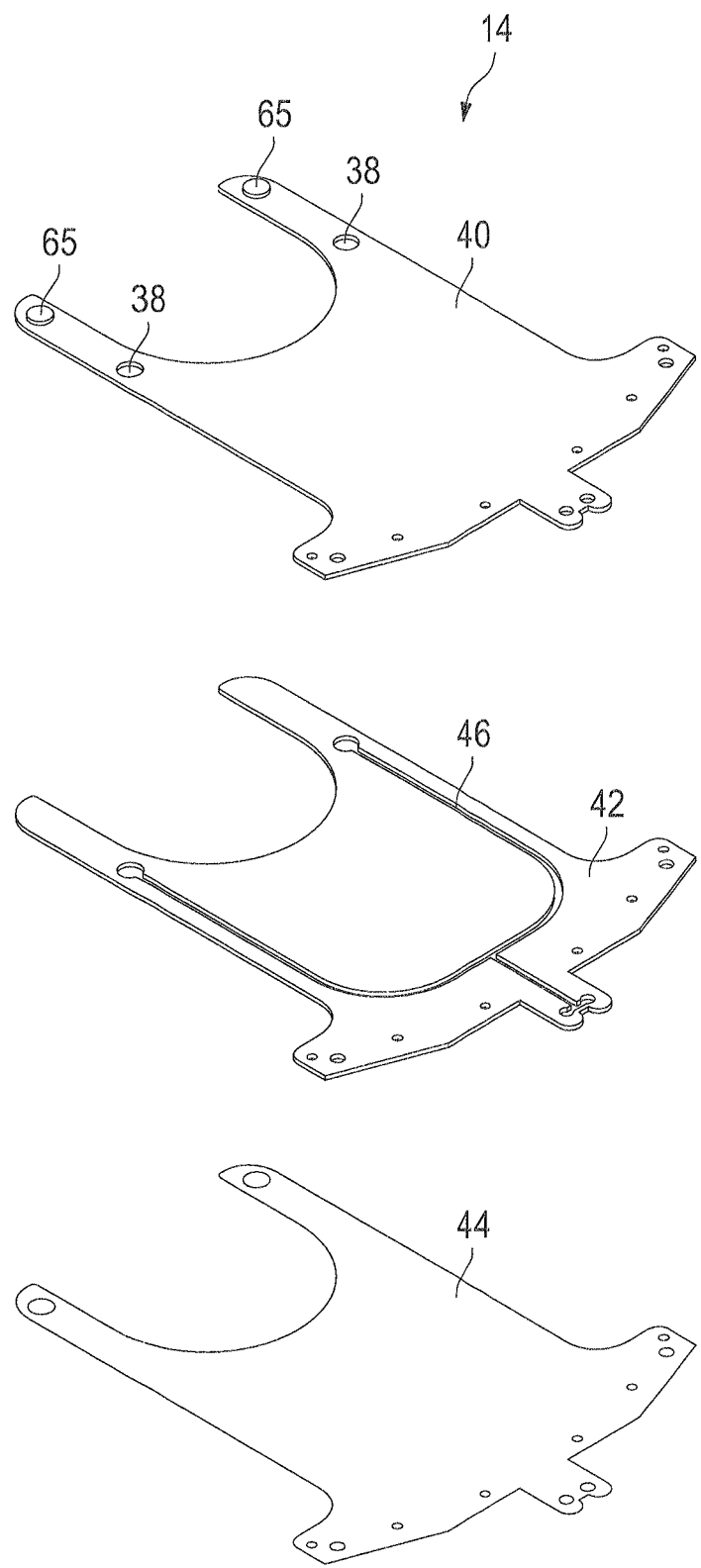
FIG. 3 shows an exploded view of the main body of the end effector in accordance with the invention as shown in FIG. 2.

FIG. 3 shows an exploded view of the main body 14. In the illustrated embodiment, the main body 14 has three layers, namely an upper layer 40, a middle layer 42 and a lower layer 44. The upper layer 40 and the lower layer 44 each form an outer layer of the main body 14.

These three layers 40, 42, 44 are all congruent and are fastened together. For example, the layers 40, 42, 44 are adhered together and can additionally also be screwed together. The three layers 40, 42, 44 can also be welded together.

Owing to the congruent arrangement of the layers 40, 42, 44, the cut-out 26 extends through all the layers 40, 42, 44.

The lower layer 44 is closed throughout, the middle layer 42 has a slot 46 to form the fluid channel 34, and the upper layer 40 is provided with the two openings 38 but otherwise is also closed throughout.

All the layers 40, 42, 44 can additionally have orifices for screws.

For example, the upper layer 40 and the middle layer 42 are each produced from a metal sheet. For example, high-grade steel or molybdenum are suitable materials.

In any case, the upper layer 40 and the middle layer 42 together have, by reason of the material properties of the metal sheet, a sufficiently high level of stability that a substrate could be held in the holding region 24 on these two layers 40, 42. Of course, it is assumed that a substrate is used having a size for which the end effector 10 as a whole is designed.

In contrast, the lower layer 44 is not inherently stable, i.e. this layer is not stable enough to be able independently to hold a substrate of the corresponding size in the holding region 24.

The lower layer can be produced from a synthetic material film. For example, polyether ether ketone (PEEK) is a suitable synthetic material.

For example, the lower layer 44 has a thickness of 0.1 mm or less.

In order to form the fluid channel 34, the slot 46 which is in the shape of the fluid channel 34 is provided in the middle layer 42. Therefore, the slot 46 is likewise Y-shaped or in the shape of a tuning fork.

When the main body 14 is in the assembled state, this slot 46 is completely covered and closed in an air-tight manner (apart from the openings 38 and the connection openings provided in the region of the flange plate 22) from above and below, i.e. in the vertical direction, by the upper layer 40 and the lower layer 44.

The fluid channel 34 terminates with the ends of the slot 46 of the middle layer 42 in the regions in which the openings 38 are provided in the uppermost layer 40.

Figure 4:
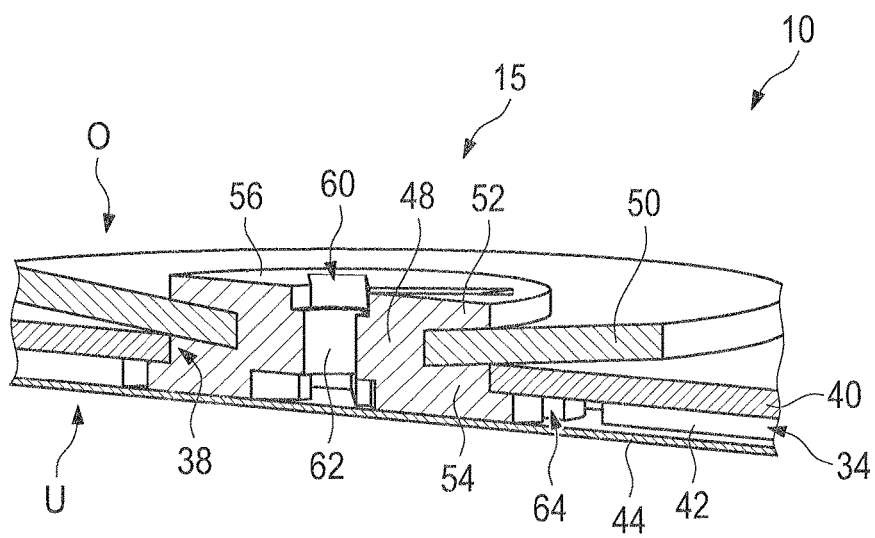
FIG. 4 shows a detailed cross-sectional view of the end effector in accordance with the invention in the region of one of the holding apparatuses.

As shown in FIG. 4, one of the holding apparatuses 15 is fastened in the illustrated opening 38.

In the illustrated embodiment, the holding apparatus 15 is a suction apparatus, in particular a vacuum suction cup, and has a carrier 48 and a sealing lip 50 which is fastened in the carrier 48.

The carrier 48 has two cylindrical portions, namely a base portion 52 and a fastening portion 54, wherein the diameter of the fastening portion 54 is greater than that of the base portion and also greater than the diameter of the opening 38.

The fastening portion 54 has a thickness which substantially corresponds to the thickness of the middle layer 42 and is disposed between the upper layer 40 and the lower layer 44.

The base portion 52 extends through the opening 38 and has a contact surface 56 on its upper side, i.e. on its side facing away from the fastening portion 54.

Suction grooves 60 are provided in the contact surface 56 and are in fluid communication with the fluid channel 34 by means of a through-channel 62 in the carrier 48 and by means of connection channels 64 in the fastening portion 54.

The sealing lip 50 is fastened to the base portion 52 on the upper side O of the main body 14 and completely surrounds the contact surface 56.

The carrier 48 is fastened to the end effector 10 in that it is passed through the middle layer 42 and the upper layer 40 and is held at that location by the lower layer 44. Furthermore, it is fixed by the sealing lip 50 which is supported on the upper side of the lower layer 40.

In order to pick up a substrate, the end effector 10 can be moved towards the substrate from below and then raise the substrate. At the same time, suction can be applied to the substrate by means of a vacuum source (not shown), which can produce a negative pressure in the suction grooves 60 by means of the fluid channel 34 which then acts as a vacuum channel.

The substrate is then pressed against the contact surface 56 by reason of the excess pressure from the ambient pressure and is thereby securely fixed to the end effector 10. The substrate then lies against the holding region 24 at least on the contact surfaces 56.

It is also feasible for the holding apparatus 15 to be designed as a fixing apparatus based on the Bernoulli effect. In this case, by means of a source of excess pressure (not shown) a gas under pressure is supplied to the fluid channel 34 and then flows out at high speed on the holding apparatus 15 and flows quickly past the substrate. A force is thereby produced on the substrate towards the end effector 10 so that the substrate is fixed on the end effector 10. The fluid channel 34 is in this case an excess pressure channel.

In addition, support surfaces 65 can be formed on the holding arms 32, in particular on the end thereof facing the receiving end 16. The support surfaces 65 can be produced from a soft material e.g. rubber. In an optimal case, the substrate then also lies against the support surfaces 65 when the substrate is fixed to the end effector 10.

Although the lower layer 44 is not inherently stable, the multi-layered structure of the main body 14 means that a stable end effector 10 as a whole is achieved. This is stable enough to be able to transport, in its holding region 24, a substrate of the size provided for this end effector 10. Owing to the fact that the lower layer 44 is formed as a thin film which is not inherently stable, the installation height of the end effector 10, in particular in the holding region 24, is clearly reduced.

Figure 5:
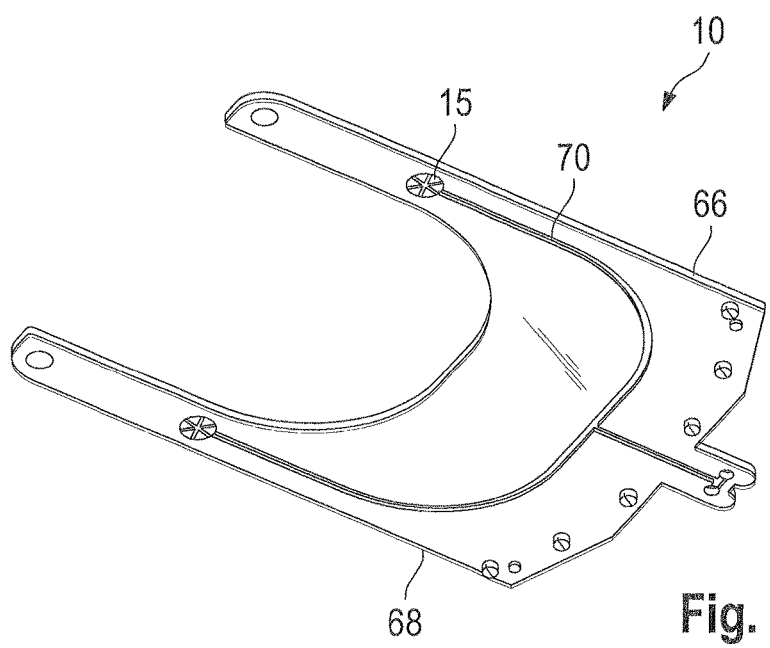
FIG. 5 shows a view from below of a second embodiment of an end effector in accordance with the invention.
Figure 6:
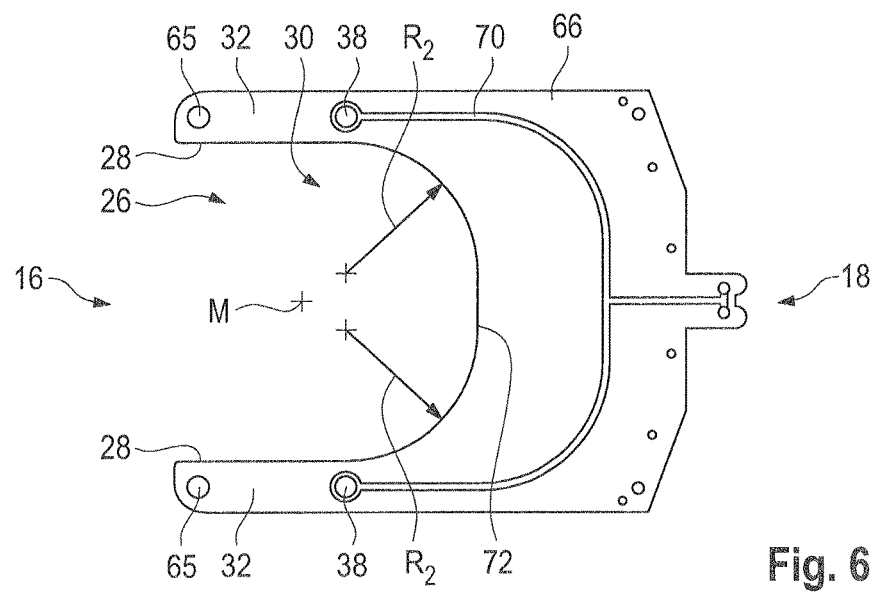
FIG. 6 shows a view from below of the upper layer of the end effector as shown in FIG. 5.

FIGS. 5 and 6 illustrate a second embodiment of an end effector 10 in accordance with the invention, which substantially corresponds to that of the first embodiment. Consequently, only the differences will be discussed hereinunder and like and functionally equivalent parts are designated by the same reference signs.

The end effector 10 illustrated in the second embodiment is designed for larger substrates than the end effector 10 of the first embodiment and so the parts in the second embodiment are dimensioned differently.

For example, the main body 14 is wider in order to be able to hold larger substrates more stably by reason of the greater spacing between the contact surfaces 56. At the same time, the cut-out 26 is also wider.

FIG. 5 shows a view of the end effector 10 of the second embodiment from below, wherein the flange plate 22 has not been shown for reasons of clarity.

In this embodiment, the main body 14 has only two layers, namely an upper layer 66 and a lower layer 68.

The lower layer 68 corresponds to the lower layer 44 of the first embodiment and is identical to the lower layer 44 of the first embodiment.

In contrast, the upper layer 66 corresponds to a combination of the upper layer 40 and the middle layer 42 of the first embodiment.

A groove 70 which partially defines the fluid channel 34 is incorporated in the upper layer 66 on the underside thereof. The groove 70 thus corresponds to the slot 46 of the first embodiment, and the groove 70 is closed by the lower layer 66 to form the fluid channel 34.

In addition, the upper layer 66 comprises the opening 38 of the fluid channel 34 towards the upper side O of the end effector 110.

The upper layer 66 can also comprise a recess for the fastening portion 54 of the holding apparatus 15.

For the purposes of illustration, in FIG. 5, the lower layer 68 is shown transparently so that the groove 70 of the upper layer 66 remains visible.

In contrast to the first embodiment, the transition region 30 of the cut-out 26 is no longer a semi-circle but has two radii $R_2$ which each describe a quarter circle. The two quarter circles are connected together by a short straight portion 72 (see FIG. 6).

Of course, the two features of the illustrated embodiments can be combined with one another. In particular, the end effector 10 of the first embodiment can be formed with two layers and the end effector of the second embodiment can be formed with three layers.

It is likewise feasible for none of the layers of the main body of an end effector to be inherently stable and for the stability required to hold substrates to be achieved only by joining these layers together.

Figure 7:
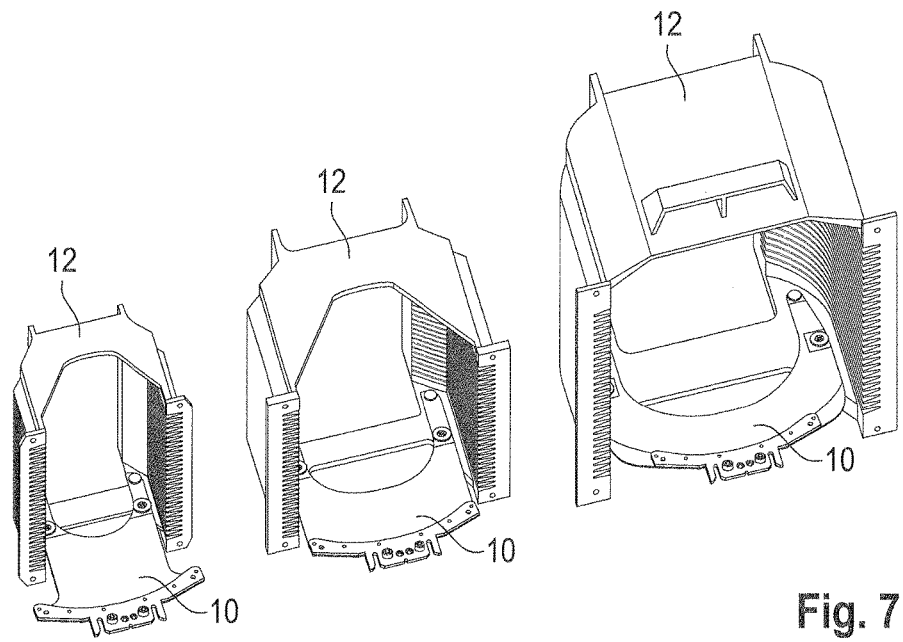
FIG. 7 shows a plurality of end effectors in accordance with the invention, being of different sizes, in cartridges for substrates of different sizes.

FIG. 7 shows end effectors 10 in three different sizes with correspondingly sized cartridges 12 for substrates. Thus, the size illustrated on the far left corresponds to the size of the first embodiment and the size illustrated in the middle corresponds to that of the second embodiment. Furthermore, a still larger size for particularly large substrates is shown on the right.

For example, the end effector on the left is designed for substrates with a diameter of at least 100 mm, the middle end effector is designed for substrates with a diameter of at least 150 mm and the end effector on the right is designed for substrates with a diameter of at least 200 mm.

Naturally, depending on the properties of the wafer, the same grippers can also be used for a plurality of wafer sizes.

In order to produce the end effector, the individual layers can be cut out at the same time, e.g. by means of a laser or water jet. This ensures that the individual layers are produced so as to be absolutely congruent. Openings which serve for mechanical connection of a plurality of layers can also be produced simultaneously in one operation for the layers to be connected, when the layers are disposed one above the other in a congruent manner.

The invention claimed is:

1. An end effector for holding substrates, having a multi-layered main body and a fluid vacuum or excess pressure channel which is provided in the main body,
    wherein the main body comprises three layers which are congruent to and fixed to one another and have the contour of the end effector,
    wherein each of the three layers is not inherently stable, but has sufficient stability to hold the substrates when the three layers are fixed together, and
    wherein none of the layers of the end effector is inherently stable.

2. The end effector as claimed in claim 1, wherein at least one of a groove and a slot is incorporated in at least one of the layers and partially defines the fluid channel.

3. The end effector as claimed in claim 2, wherein the at least one of a groove and a slot is covered and sealed by at least another one of the layers.

4. The end effector as claimed in claim 3, wherein the middle layer of the three layers is provided with the slot which is covered by the outer two layers, thus forming the fluid channel.

5. The end effector as claimed in claim 2, wherein the layer in which the at least one of a groove and a slot is incorporated, is formed from a metal sheet.

6. The end effector as claimed in claim 1, wherein at least one of three layers is a prefabricated component.

7. The end effector as claimed in claim 1, wherein the layers are formed from a synthetic material film.

8. The end effector as claimed in claim 1, wherein the main body comprises a receiving end and a fastening end, wherein a holding region for holding the substrate is provided on the receiving end.

9. The end effector as claimed in claim 8, wherein a cut-out extends from the receiving end into the main body, wherein holding arms are formed by the cut-out.

10. The end effector as claimed in claim 9, wherein the cut-out comprises at least one radius on its end facing the fastening end and is U-shaped.

11. The end effector as claimed claim 9, wherein the fluid channel extends from the fastening end into the holding arms and at that location issues into openings.

12. The end effector as claimed in claim 11, wherein a sealing lip is provided in or on the opening.

13. The end effector as claimed in claim 11, wherein a vacuum suction cup or a fixing apparatus based on the Bernoulli effect is provided in or on the openings.

14. The end effector as claimed in claim 8, wherein a flange plate, is provided on the fastening end in order to fasten the end effector to robotic arm.

15. The end effector as claimed in claim 1, wherein the main body consists of three layers.

16. An end effector for holding substrates, having a multi-layered main body and a fluid vacuum or excess pressure channel which is provided in the main body,
    wherein the main body comprises at least two layers which are congruent and fixed to one another,
    wherein at least one of the at least two layers is a prefabricated component,
    wherein each of the two layers is not inherently stable, but has sufficient stability to hold the substrates when the two layers are fixed together,
    wherein the main body comprises a receiving end and a fastening end, and
    wherein a holding region for holding the substrate is provided on the receiving end and a flange region is provided at the fastening end.

17. The end effector as claimed in claim 16, wherein the layers are formed from a synthetic material film.

18. An end effector for holding substrates, having a multi-layered main body and a fluid vacuum or excess pressure channel which is provided in the main body,
    wherein the main body comprises at least two layers which are fixed to one another,
    wherein the two layers are not inherently stable, but have sufficient stability to hold the substrates when the two layers are fixed together, and
    wherein the fluid channel issues into openings, wherein a vacuum suction cup is provided in the openings and comprises a separate sealing lip, and
    wherein the main body comprises an upper layer, a middle layer and a lower layer, and
    the vacuum suction cup has a carrier that is passed through the middle layer and the upper layer is held in position by the lower layer.

19. The end effector as claimed in claim 18, wherein the layers are formed from a synthetic material film.

20. An end effector for holding substrates, having a multi-layered main body and a fluid vacuum or excess pressure channel which is provided in the main body,
- wherein the main body comprises three layers which are congruent to and fixed to one another and have the contour of the end effector, and
- wherein each of the three layers is not inherently stable but has sufficient stability to hold the substrates when the three layers are fixed together, and
- wherein the middle layer of the three layers is provided with a slot which is covered and sealed by the outer two layers, thus forming the fluid channel.

* * * * *